(12) United States Patent
Ogasawara

(10) Patent No.: US 8,533,364 B2
(45) Date of Patent: *Sep. 10, 2013

(54) APPARATUS THAT PREVENT A MALFUNCTION OF THE CIRCUIT AND REDUCE POWER CONSUMPTION

(75) Inventor: Yasufumi Ogasawara, Tachikawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/339,296

(22) Filed: Dec. 28, 2011

(65) Prior Publication Data

US 2012/0110362 A1    May 3, 2012

Related U.S. Application Data

(63) Continuation of application No. 12/184,894, filed on Aug. 1, 2008, now Pat. No. 8,108,561.

(30) Foreign Application Priority Data

Aug. 20, 2007 (JP) ................................. 2007-213827

(51) Int. Cl.
*G06F 3/00* (2006.01)
*H01H 27/00* (2006.01)

(52) U.S. Cl.
USPC ............................................. 710/2; 307/125

(58) Field of Classification Search
USPC .......................................... 710/2; 307/125
See application file for complete search history.

(56) References Cited

U.S. PATENT DOCUMENTS

| 5,461,266 | A | * | 10/1995 | Koreeda et al. | ............... 307/125 |
| 5,519,712 | A | * | 5/1996 | Shu et al. | ...................... 365/201 |
| 8,108,561 | B2 | * | 1/2012 | Ogasawara | ........................ 710/2 |
| 2008/0005636 | A1 | * | 1/2008 | Conrad et al. | ................ 714/748 |
| 2009/0051404 | A1 | * | 2/2009 | Ogasawara | .................... 327/365 |

FOREIGN PATENT DOCUMENTS

| JP | 62-130416 A | 6/1987 |
| JP | 08-320743 A | 12/1996 |
| JP | 2003-203044 A | 7/2003 |

* cited by examiner

*Primary Examiner* — Hyun Nam
(74) *Attorney, Agent, or Firm* — Canon USA Inc IP Division

(57) ABSTRACT

An interface circuit provided with a first input/output unit and a second input/output unit which respectively access external apparatuses to which electric power is supplied from power sources via different electric power supply lines includes an acquisition unit configured to acquire information whether electric power is supplied to the respective external apparatuses based on a command from the outside; a selection circuit configured to select an input/output unit corresponding to an external apparatus to which electric power is supplied, from the first input/output unit and the second input/output unit based on the information acquired by the acquisition unit; and a control circuit configured to output an instruction corresponding to the command, to the external apparatus to which electric power is supplied, via the input/output unit selected by the selection circuit.

4 Claims, 8 Drawing Sheets

FIG. 4

| PATTERN | STATE OF CONTROL SIGNAL AND INPUT SIGNAL | | | | SETTING BY TERMINAL CONTROL CIRCUIT 303 | |
|---|---|---|---|---|---|---|
| | SIGNAL 310 | SIGNAL 311 | VDD1 | VDD2 | TERMINAL 1 | TERMINAL 2 |
| PATTERN 1 | ON | OFF | / | / | CONNECTED TO COMMUNICATION DATA GENERATION CIRCUIT 302 | SET TO INPUT STATE |
| PATTERN 2 | ON | OFF | / | / | SET TO INPUT STATE | SET TO INPUT STATE |
| PATTERN 3 | OFF | ON | / | / | SET TO INPUT STATE | CONNECTED TO COMMUNICATION DATA GENERATION CIRCUIT 302 |
| PATTERN 4 | OFF | ON | / | / | SET TO INPUT STATE | SET TO INPUT STATE |
| PATTERN 5 | / | / | ON | OFF | CONNECTED TO COMMUNICATION DATA GENERATION CIRCUIT 302 | SET TO INPUT STATE |
| PATTERN 6 | / | / | OFF | OFF | SET TO INPUT STATE | SET TO INPUT STATE |
| PATTERN 7 | / | / | OFF | ON | SET TO INPUT STATE | CONNECTED TO COMMUNICATION DATA GENERATION CIRCUIT 302 |

APPARATUS THAT PREVENT A MALFUNCTION OF THE CIRCUIT AND REDUCE POWER CONSUMPTION

CROSS REFERENCE TO RELATED APPLICATIONS

The present application is a continuation of U.S. patent application Ser. No. 12/184,894, filed on Aug. 1, 2008, entitled "APPARATUS THAT PREVENT A MALFUNCTION OF THE CIRCUIT AND REDUCE POWER CONSUMPTION", the content of which is expressly incorporated by reference herein in its entirety. This application also claims priority from Japanese Patent Application No. 2007-213827 filed Aug. 20, 2007, which is hereby incorporated by reference herein in its entirety.

BACKGROUND OF THE INVENTION

1. Field of the Invention

The present invention relates to an interface circuit, an integrated circuit apparatus including the interface circuit, and an electronic apparatus including the interface circuit.

2. Description of the Related Art

In recent years, along with a reduction in size and thickness of an electronic apparatus, a circuit board to control the electronic apparatus has been miniaturized. A method for realizing miniaturization of such circuit board includes a system-on-chip technology to mount a number of functions on a single integrated circuit apparatus. In particular, the system-on-chip technology is frequently used in an application specific integrated circuit (ASIC). Functions incorporated into an integrated circuit by the system-on-chip technology include, for example, analog to digital conversion, specific logic operation, communication control, sequence control by a central processing unit (CPU) or the like. As a result of such increased integration of various functions, the size of the ASIC is also increasing. To address a problem, as ASIC is designed which enables using of a circuit having specific functions in the ASIC for a plurality of applications.

In particular, in a case where the ASIC is configured to communicate with a plurality of elements (for example, memory such as electrically erasable programmable read-only memory (EEPROM)), a method of communicating with a plurality of elements using one communication data generation circuit inside the ASIC has been conventionally considered.

For example, there is a method for disposing communication signal lines connecting a plurality of elements in parallel to each other on a circuit board so that a target element for communication can be selected by controlling a chip select signal. However, a problem arises when each of a plurality of elements receives electric power (supplied by different electric power system) having a different voltage for its operation.

The problem is that a communication signal to be input to an element which is supplied with electric power is input to an element which is not supplied with electric power. The input of this signal may result in a failure or a malfunction of the element receiving no electric power supply.

To address this problem, there is a conventional technology that connects a diode or the like to a communication signal line on a circuit board.

FIG. 5 is a circuit diagram discussed in Japanese Patent Application Laid-Open No. 2-242313. A main apparatus 11 is connected with peripheral apparatuses 21 and 22 arranged in parallel to each other. The peripheral apparatuses 21 and 22 are supplied with different voltages, that is, VCC1 and VCC2 respectively.

Each input terminal of the peripheral apparatuses 21 and 22 is pulled up by each voltage. The No. 2-242313 discusses that even if the voltages VCC1 and VCC2 are different, when a transistor 11a is turned off, the come-around of a voltage signal can be prevented by a diode 41 or 42.

FIG. 6 is a circuit diagram discussed in Japanese Patent Application Laid-Open No. 2002-132401. A microprocessor unit (MPU) 30 and a data processing random access memory unit (DPRAM) 40 are respectively run by different power source systems MVCC and SVCC. A diode D1 and a diode D2 are connected to one another with reverse polarity. For example, when the power source system SVCC is disconnected, signal lines S1, S2, and S3 are pulled up by the power source system MVCC. However, the come-around of a voltage signal to the power source system SVCC side can be prevented by addition of the diode D2.

However, in the conventional circuits discussed in Japanese Patent Application Laid-Open No. 2-242313 and Japanese Patent Application Laid-Open No. 2002-132401, it is required to mount an additional component (diode) on a circuit board. This results in the increase of component count and manufacturing cost. Further, the increase of component count restricts pattern design of circuit wiring and interferes with miniaturization of an electronic circuit board.

To avoid additional components, there is a method for supplying electric power to all elements connected in parallel when executing communication with an element. In this method, electric power is supplied to all elements including an element that does not obtain access.

For example, in an electronic apparatus, to reduce electric power consumption during standby, electric power is supplied only just before and after an access is obtained. However, in the above-described method for supplying electric power to all elements, electric power is supplied and terminated although an element is not accessed, thus the frequency of supply and suspension of electric power is increased. Such increased frequency can reduce the life of elements.

Further, in the method of supplying electric power to all elements, elements cannot be protected when a failure of an electric power supply system occurs.

SUMMARY OF THE INVENTION

The present invention is directed to an interface circuit and an integrated circuit apparatus that prevent a failure or a malfunction of an element and reduce power consumption.

According to an aspect of the present invention, an interface circuit provided with a first input/output unit and a second input/output unit which respectively access external apparatuses to which electric power is supplied from power sources via different electric power supply lines includes an acquisition unit configured to acquire information whether electric power is supplied to the respective external apparatuses based on a command from the outside; a selection circuit configured to select an input/output unit corresponding to an external apparatus to which electric power is supplied from the first input/output unit and the second input/output unit based on the information acquired by the acquisition unit; and a control circuit configured to output an instruction corresponding to the command to the external apparatus to which electric power is supplied, via the input/output unit selected by the selection circuit.

According to another aspect of the present invention, an integrated circuit apparatus provided with a first input/output unit and a second input/output unit which respectively access elements to which electric power is supplied from power sources via different electric power supply lines includes an acquisition unit configured to acquire information whether electric power is supplied to the respective elements based on a command from the outside; a generation circuit configured to generate at least one of a command or data based on the command from the outside; a selection circuit configured to select an input/output unit corresponding to an element to which electric power is supplied from the first input/output unit and the second input/output unit based on the information acquired by the acquisition unit; and a control circuit configured to output the command and the data generated by the generation circuit to the element to which electric power is supplied, via the input/output unit selected by the selection circuit.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIG. 4 is a diagram illustrating setting and a state of control of a terminal control circuit according to an exemplary embodiment of the present invention.

DETAILED DESCRIPTION OF THE EMBODIMENTS

Various exemplary embodiments, features, and aspects of the invention will be described in detail below with reference to the drawings.

First Exemplary Embodiment

Figure 1:
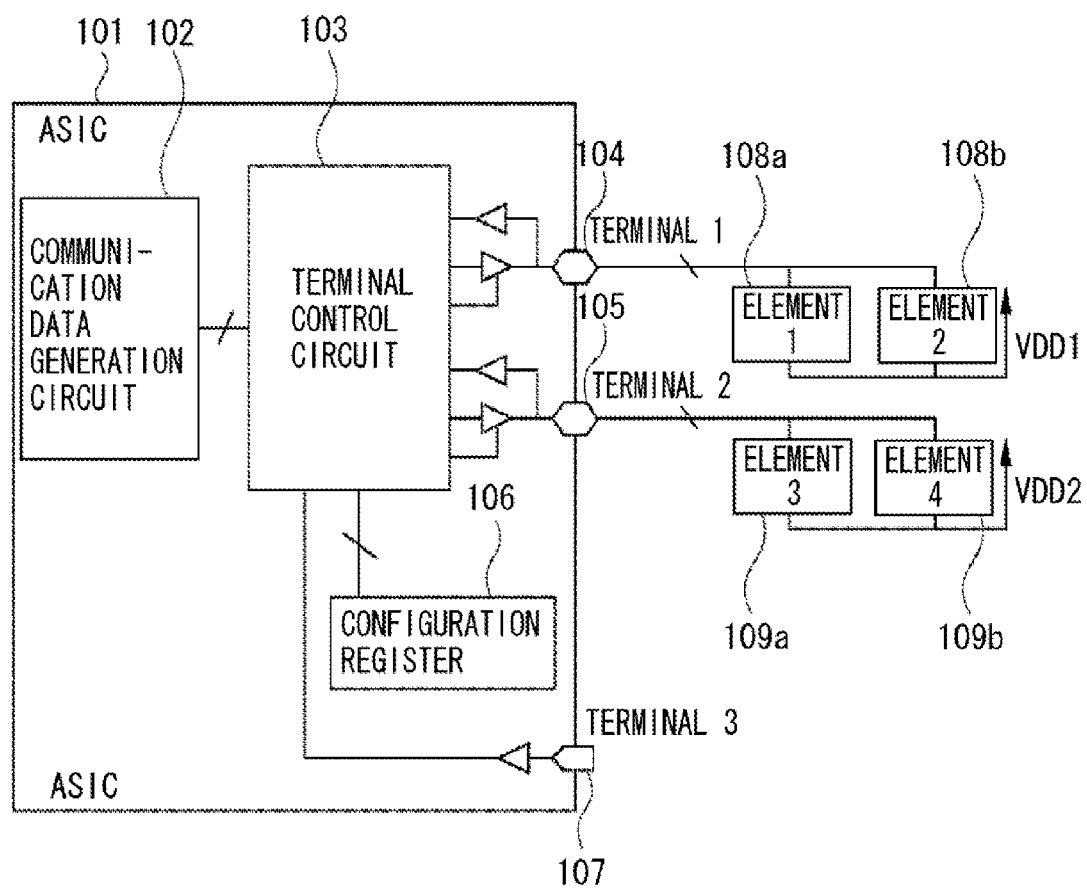
FIG. 1 is a diagram illustrating an example integrated circuit containing a terminal control circuit according to an exemplary embodiment of the present invention.

FIG. 1 is a diagram illustrating an integrated circuit including a terminal control circuit according to an exemplary embodiment of the present invention. An ASIC 101 includes a terminal control circuit 103. Elements 108a and 108b are connected with a terminal 1 via a common signal line. Elements 109a and 109b are connected with a terminal 2 via a common signal line. Thus, the ASIC (integrated circuit) 101 includes a plurality of input/output units which is the terminal (terminal group) 1 and the terminal (terminal group) 2. In the present embodiment, data is transferred in a serial format.

The respective terminals 1 and 2 include a plurality (four) of terminals. The terminal 1 includes a terminal that outputs a clock signal, a terminal that inputs and outputs data, a terminal that outputs a flash signal, and a terminal that outputs a chip select signal. Here, in order to simplify description, only the terminal that inputs and outputs data is identified with a numeral 104. The terminal 2 also includes a terminal that outputs a clock signal, a terminal that inputs and outputs data, and a terminal that outputs a chip select signal. Only the terminal that inputs and outputs data is identified with a numeral 105.

Each of the above elements 108a, 108b, 109a, and 109b is connected with the ASIC 101 on a circuit board via the terminals 1 and 2 of the ASIC 101. The elements 108a and 108b, and the elements 109a and 109b are connected to different power sources. That is, the elements 108a and 108b, and the elements 109a and 109b are connected to different power supply lines (power source system).

The elements 108a and 108b are supplied with a voltage VDD1 (for example, 3.3 volts), and the elements 109a and 109b are supplied with a voltage VDD2 (for example, 3.3 volts). The elements 108a and 108b are, for example, an EEPROM (memory). The ASIC 101 is connected to respective elements via a plurality of signal lines (for example, clock signal line, data line). The ASIC 101 outputs a chip select (CS) signal corresponding to the respective elements in order to selectively have access.

The ASIC 101 includes a terminal 3 (107) other than the terminals 1 and 2. A signal input from the terminal 107 is connected to the terminal control circuit 103. The terminal control circuit 103 is connected to a communication data generation circuit 102, a configuration register 106, terminals 104 and 105 other than the terminal 107.

The communication data generation circuit 102 generates commands and data for communicating with the elements 108a, 108b, 109a, and 109b. The communication data generation circuit 102 includes a buffer (reception buffer) for holding data received from respective elements, and a buffer (transmission buffer) for holding commands and data which are transmitted to respective elements.

The terminal control circuit 103 further makes enable/disable setting of the terminals 104 and 105, and input/output setting of the terminals 104 and 105 with the communication data generation circuit 102 based on information set by the configuration register 106 and information input from the terminals 104, 105 and 107. Furthermore, the terminal control circuit 103 sets an output level when a terminal is used as an output terminal.

As an example, a case will be described in which information (commands or instructions) input from the terminal 107 indicates that the voltage VDD1 is supplied and the voltage VDD2 is not supplied. In this case, the terminal control circuit 103 executes control so that the elements 108a and 108b to which the voltage VDD1 is supplied are accessed.

On the other hand, a case will be described in which information (commands or instructions) input from the terminal 107 indicates that the voltage VDD2 is supplied and the voltage VDD1 is not supplied. The terminal control circuit 103 executes control so that the elements 109a and 109b to which the voltage VDD2 is supplied are accessed. Thus, the terminal control circuit 103 acquires information from the outside via the terminal 107 and operates based on the acquired information.

Figure 2:
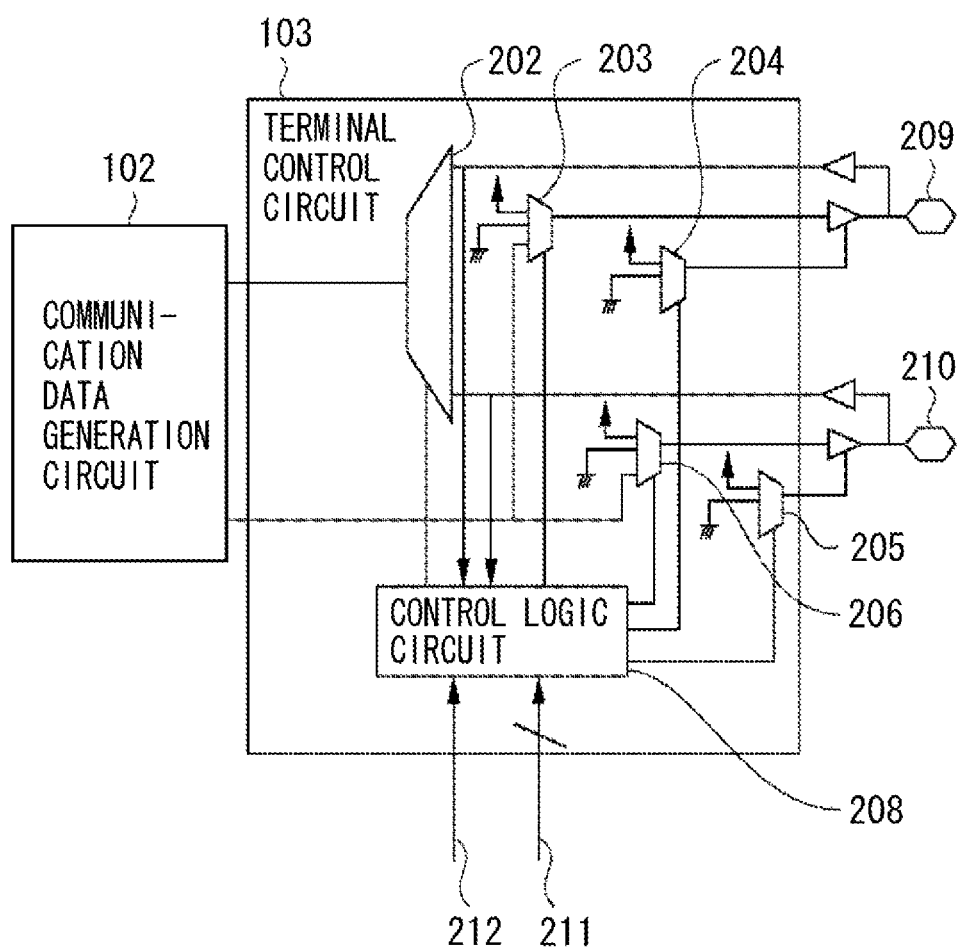
FIG. 2 is a diagram illustrating an example internal configuration of a terminal control circuit according to an exemplary embodiment of the present invention.

FIG. 2 is a diagram illustrating the internal configuration of the terminal control circuit (interface circuit) 103 included in the ASIC 101 and its connection with the outside.

The terminal control circuit 103 includes a plurality of selectors (selection circuits) 202, 203, 204, 205 and 206, and a control logic circuit 208. The control logic circuit 208 operates based on the input 212 of the terminal 107 and the input 211 of the configuration register 106. The control logic circuit 208 controls changeover of the selector 202, the selector 203, the selector 204, the selector 205, and the selector 206.

The selector 203 and the selector 204 are connected to a terminal 209 (terminal 104 in FIG. 1). Similarly, the selector 205 and the selector 206 are connected to a terminal 210 (terminal 105 in FIG. 1).

The control logic circuit 208 controls changeover of the selectors 202, 203, 204, 205 and 206 based on a signal input 211, a signal input 212, an input from the terminals 209 and 210, or the combination thereof.

A signal output from the communication data generation circuit 102 is input to the selectors 203 and 206.

The selectors 203 and 206 respectively switches an output state by a selection signal from the control logic circuit 208. That is, the selectors 203 and 206 select the contents of output when in the state of output. The selectors 203 and 206 select any of a high level, a low level and an output based on data. For example, if the selector 203 selects a high level, a state of the terminal 209 becomes a high level. If the selector 203 selects a low level, a state of the terminal 209 becomes a low level. If the selector 203 selects an output based on data, a state of the terminal 209 (state of high level and state of low level) is changed based on the data and commands generated by the communication data generation circuit 102. The function of the selector 206 is similar and an output state of the terminal 210 can be selected.

The selectors 204 and 205 switches input and output of the terminals 209 and 210. The selectors 204 and 205 select an output state or an input state based on a selection signal from the control logic circuit 208. Each selection signal from the control logic circuit 208 can be associated with each other or individually set. The settings are made by a signal 211. The signal 211 is a signal corresponding to an output value of the configuration register 106 in FIG. 1.

When data is input from the terminal 209, the data is transferred to the communication data generation circuit 102 via the selector 202 and stored in a reception buffer provided on the communication data generation circuit 102. Similarly, when the data is input from the terminal 210, the data is transferred to the communication data generation circuit 102 via the selector 202.

Second Exemplary Embodiment

Figure 3:
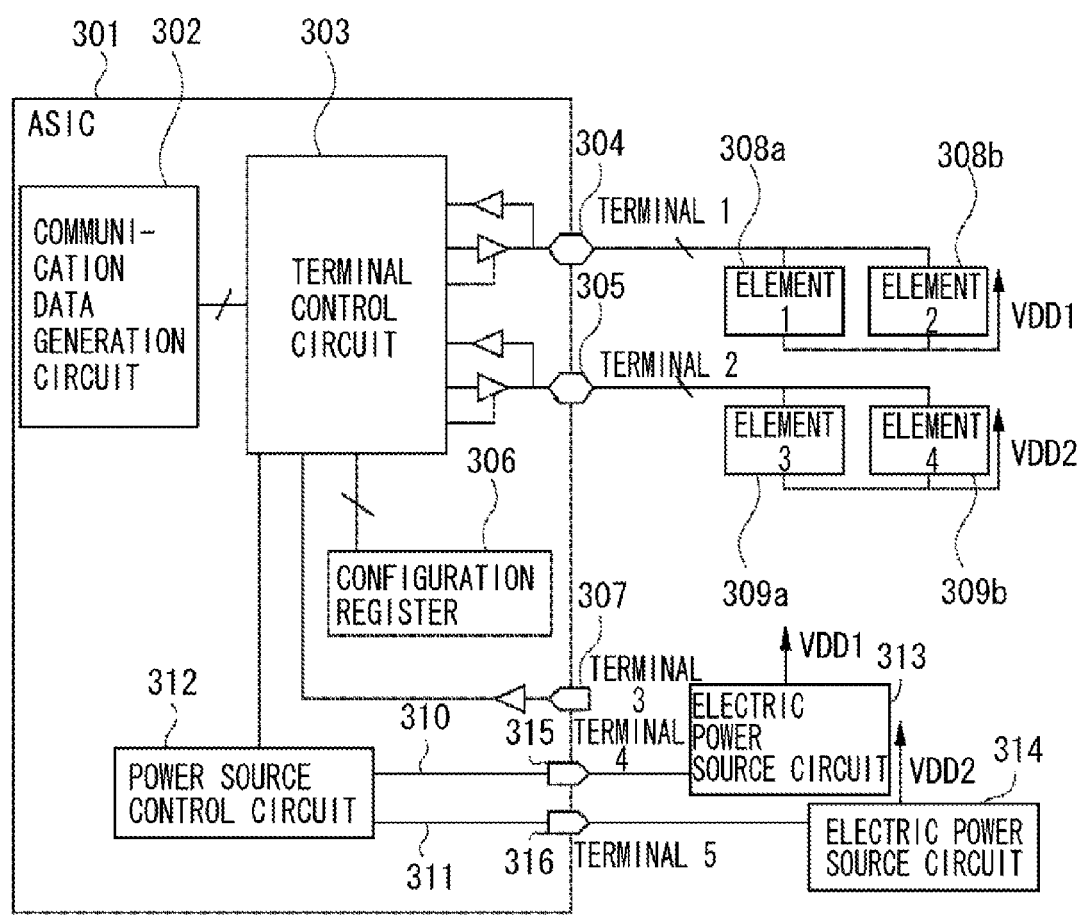
FIG. 3 is a diagram illustrating an example integrated circuit including a terminal control circuit according to an exemplary embodiment of the present invention.
Figure 5:
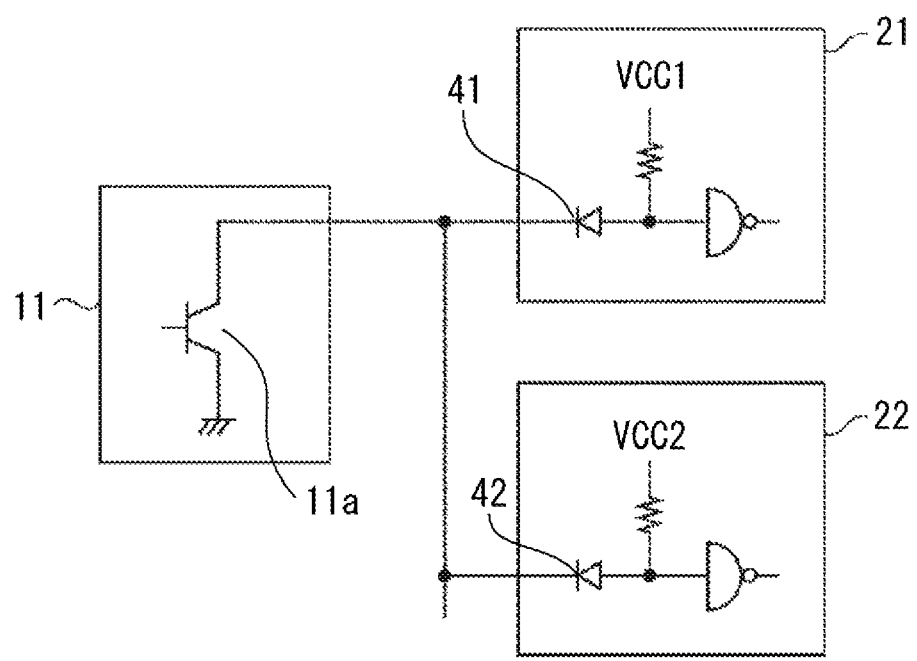
FIG. 5 is a diagram illustrating a conventional circuit.
Figure 6:
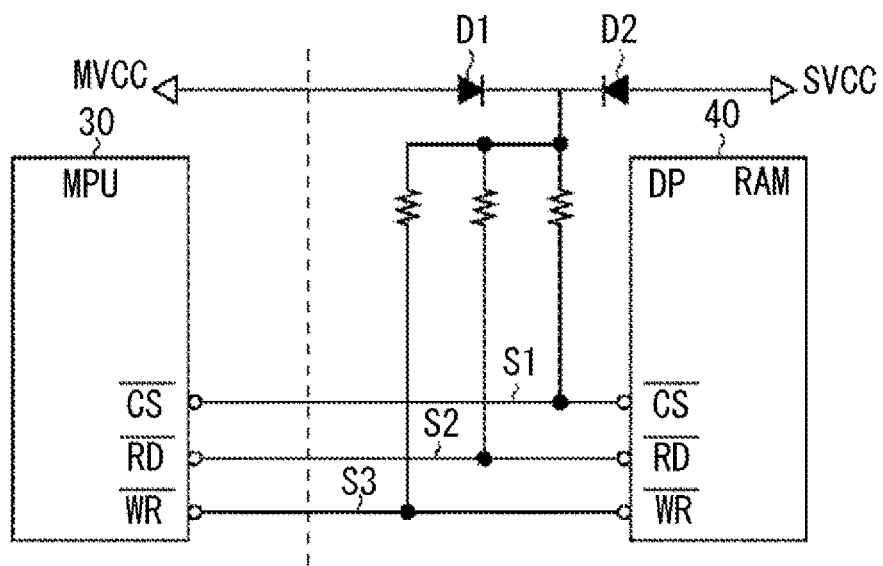
FIG. 6 is a diagram illustrating another conventional circuit.

Next, a second exemplary embodiment will be described with reference to FIG. 3.

An ASIC 301 includes a terminal control circuit 303, a communication data generation circuit 302, a power source control circuit 312, a configuration register 306, and terminals 304 (terminal 1), 305 (terminal 2), 307 (terminal 3), 315 (terminal 4) and 316 (terminal 5). Electric power source circuits 313 and 314 are connected to the ASIC 301. The power source control circuit 312 instructs output/suspension of electric power supply to elements 308a, 308b, 309a, and 309b. 310 and 311 are lines for control signal. That is, the power source control circuit 312 is an electric power supply instruction circuit. In other words, the power source control circuit 312 instructs permission/prohibition of electric power supply to elements. Thus, the ASIC 301 is configured to independently control output of the voltage VDD1 and the voltage VDD2.

The instruction of output/suspension of electric power supply is output to the electric power source circuit 313 via the terminal 315 and output to the electric power source circuit 314 via the terminal 316. The contents of the instruction are transmitted to the terminal control circuit 303. The terminal control circuit 303 makes a setting to the internal selectors and the communication data generation circuit 302 based on the instruction. The electric power source circuit 313 supplies the voltage VDD1 to the elements 308a and 308b. The electric power source circuit 314 supplies the voltage VDD2 to the elements 309a and 309b.

For example, if information input from the configuration register 306 is an instruction to access the element 308a, the power source control circuit 312 instructs the electric power source circuit 313 to supply electric power. Thereafter, the terminal control circuit 303 makes a setting with respect to the terminal 304 so that the element 308a is accessed. In this case, since the terminal control circuit 303 does not have an access to the terminal 305, the terminal control circuit 303 makes a setting to the terminal 305 so that the terminal 305 is in an input state. Further, if information input from the configuration register 306 is an instruction to access the element 309a, the power source control circuit 312 issues an instruction for power supply to the electric power source circuit 314. Thereafter, the terminal control circuit 103 executes control so that the element 309a is accessed.

Thus, the power source control circuit 312 makes a setting to enable a terminal corresponding to an element performing communication, to execute communication and further executes control so that electric power is supplied to the element.

Thus, the power source control circuit 312 notifies the terminal control circuit 303 that electric power supply has been executed. The terminal control circuit 303 sets a terminal which does not perform communication, to be in an input state.

By executing such control, an unnecessary signal is not transmitted to an element that does not perform communication, and a failure or a malfunction of an element is prevented.

Third Exemplary Embodiment

Next, a third exemplary embodiment of the present invention will be described. In the third exemplary embodiment, the terminal control circuit 303 (FIG. 3) determines whether electric power is supplied to an element based on a state input from a terminal.

For example, the terminal control circuit 303 detects the level of voltage of a communication signal from the terminal 304 (FIG. 3) and determines whether the voltage VDD1 is supplied. That is, a level determination circuit provided on the terminal control circuit 303 is used. In this case, the terminal control circuit 303 determines whether electric power is supplied. If electric power is not supplied, the terminal control circuit 303 waits until electric power is supplied and then executes control to perform communication with the element 308a or 308b. As to the terminal 305, the similar processing may be executed.

With reference to FIG. 4, the description made so far is put in order. FIG. 4 illustrates one example of a signal input to the terminal control circuit 303, and a state of the terminal 304 (terminal 1) and the terminal 305 (terminal 2) that the terminal control circuit 303 sets with the input signal. Information about the configuration register 306 is not described in FIG. 4.

A pattern 1 is a case in which the element 308a or 308b is used. In order to use the element 308a or 308b, the terminal control circuit 303 causes the power source control circuit 312 to make the signal 310 enable (permission). The terminal control circuit 303 connects the terminal 304 with the communication data generation circuit 302. On the other hand, since the elements 309a and 309b are not used, the terminal control circuit 303 causes the power source control circuit 312 to make the signal 311 disenable (prohibition). The terminal control circuit 303 sets the terminal 305 to be in an input state. A failure or a malfunction of elements can be prevented by such a setting. A pattern 3 is a case in which the element 309a or 309b is used. That is, the pattern 3 is a case opposite to the pattern 1. Thus, its processing is inverse.

A pattern 2 is a case in which the element 308a or 308b is used. However, the terminal control circuit 303 monitors a state of the terminal 1 (electric potential of VDD1) and has determined that the terminal 1 is not at a desired electric potential. It can be considered from this state that, for example, the element 308a or 308b does not work. Accordingly, the terminal control circuit 303 sets the terminal 1 to be in an input state.

A pattern 4 is a case in which the element 309a or 309b is used. However, the terminal control circuit 303 has determined that the terminal 2 (electric potential of VDD2) is not at a desired potential. It can be considered from this state that, for example, the element 309a or 309b does not work. Accordingly, the terminal control circuit 303 sets the terminal 2 to be in an input state.

A pattern 5 is a case in which the element 308a or 308b is used. In this case, the terminal control circuit 303 monitors a state of the terminal 1. If the terminal control circuit 303 can determine that electric power is supplied to the element 308a or 308b, the terminal control circuit 303 connects the terminal 1 with the communication data generation circuit 302.

A pattern 6 monitors states of the terminal 1 and the terminal 2. If the terminal control circuit 303 determines that electric power is not supplied either to the elements 308a and 308b, or to the elements 309a and 309b, the terminal control circuit 303 sets the terminal 1 and the terminal 2 to be in an input state.

A pattern 7 is a case in which the element 309a or 309b is used. In this case, the terminal control circuit 303 monitors a state of the terminal 2. If the terminal control circuit 303 can determine that electric power is supplied to the element 309a or 309b, the terminal control circuit 303 connects the terminal 2 with the communication data generation circuit 302.

Fourth Exemplary Embodiment

Figure 7:
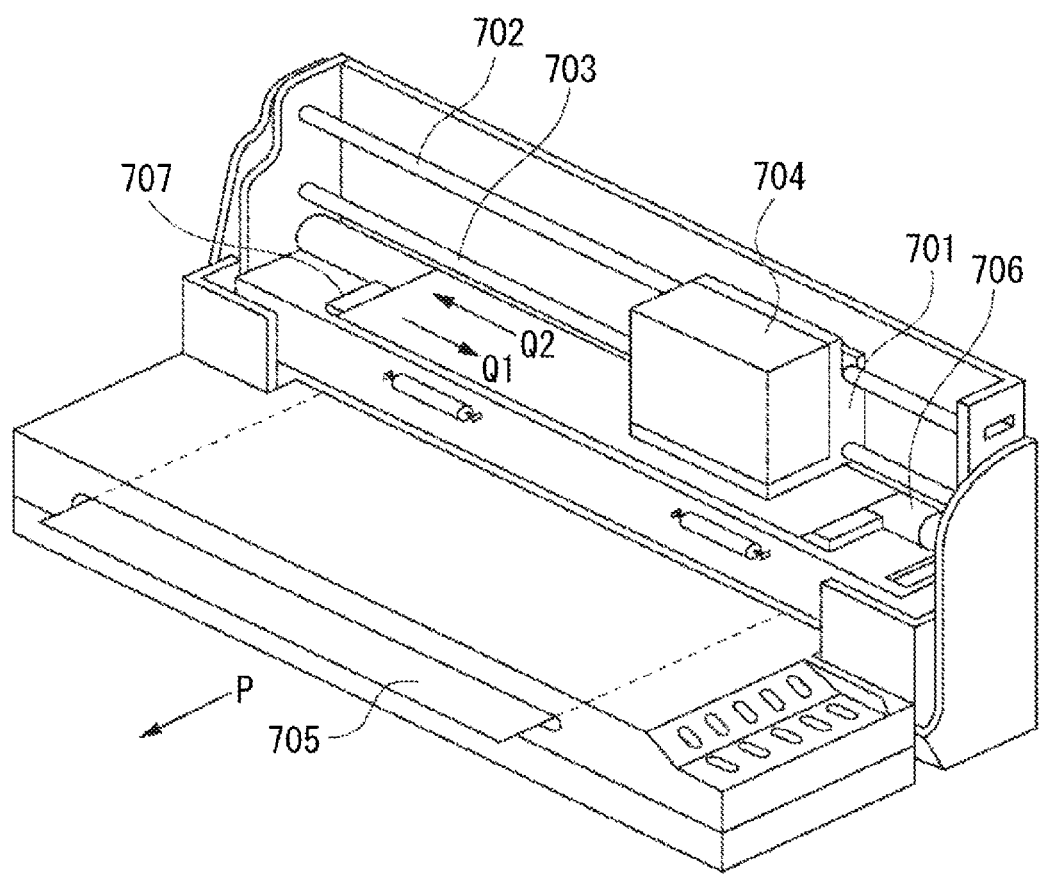
FIG. 7 is a perspective view illustrating an example recording apparatus to which a terminal control circuit is applied according to an exemplary embodiment of the present invention.

FIG. 7 is a perspective view illustrating a recording apparatus as an electronic apparatus to which an ASIC according to the above-described exemplary embodiment is applied.

In FIG. 7, a recording head 704 mounted on a carriage 701 includes discharge ports capable of discharging ink and an ink tank which contains ink. The discharge ports of the recording head 704 are mounted on the carriage 701 that faces downwardly to discharge ink and record an image onto a recording medium 705 located below. The recording head 704 is provided with an EEPROM (not shown).

The carriage 701 is movably supported along the axis direction by two guide axes 702 and 703. The carriage 701 reciprocally scans a scan area including a recording area along a direction indicated by arrows Q1 and Q2 driven by a carriage motor (not shown). The direction of arrows Q1 and Q2 is a main scanning direction. After one main scanning is completed by the carriage 701, a conveyance roller 706 conveys the recording medium 705 by a certain amount (distance corresponding to recording width of the recording head 704) in a sub-scanning direction. The sub-scanning direction is a direction of an arrow P. Thus, recording of one page is executed by repeating the scan (operation) with the recording head 704 and the conveyance (operation) of the recording medium 705. A platen 707 is shown in FIG. 7.

Figure 8:
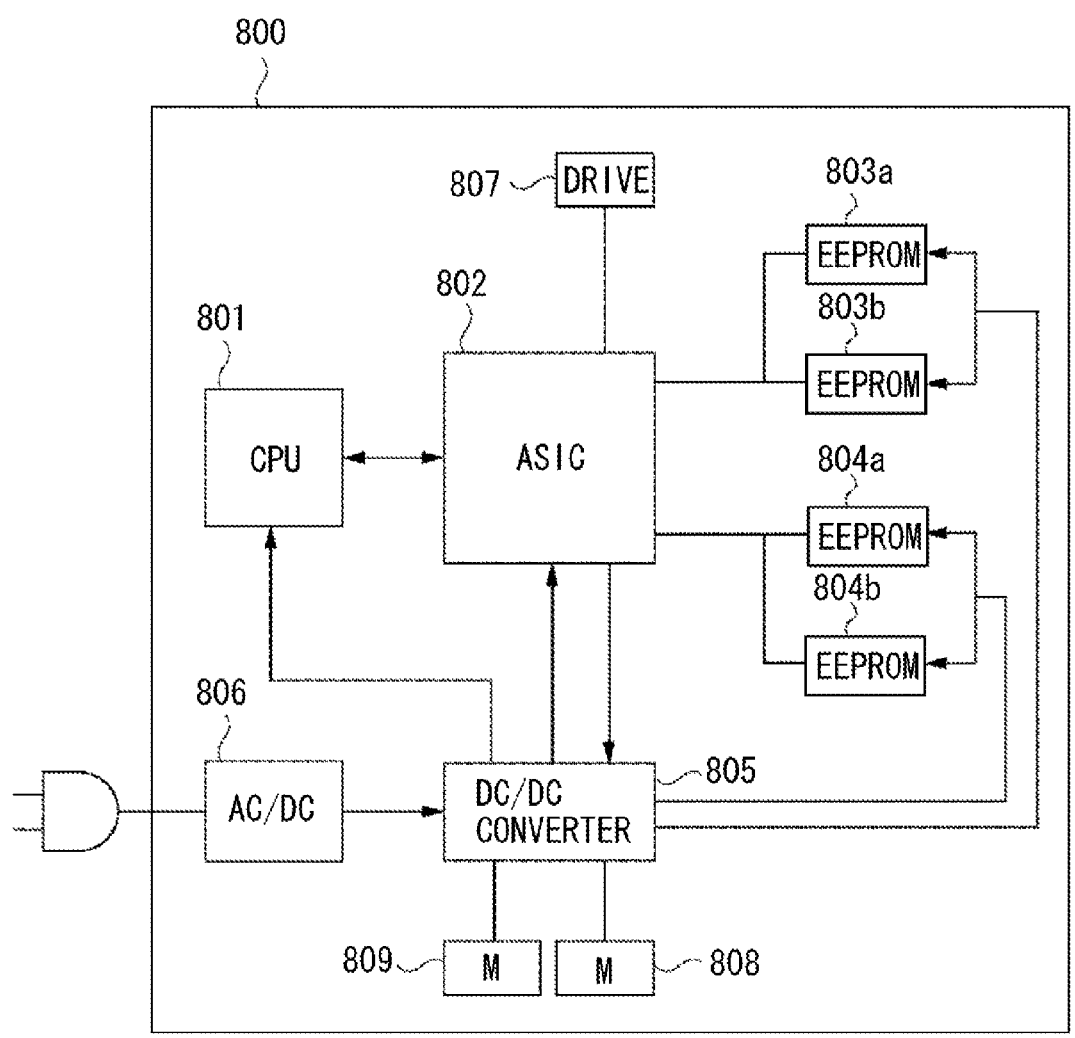
FIG. 8 is a block diagram illustrating an example recording apparatus according to an exemplary embodiment of the present invention.

FIG. 8 is a control block diagram illustrating the recording apparatus described in FIG. 7. A circuit block 800 includes the recording apparatus and a recording head. A CPU 801 controls operation of the recording apparatus. An ASIC 802 includes a block which generates a control signal for driving the recording head mounted on the recording apparatus and a control signal for driving a motor. For example, in the first exemplary embodiment, the CPU 801 outputs commands or instructions to the terminal 3 (numeral 107). Alternatively, for example, the CPU 801 writes (store) commands or instructions to the configuration register 106. These commands are a read command to read data stored in an EEPROM as described below or a write command to store (write) data in the EEPROM.

The recording apparatus includes EEPROMs 803a and 803b, and EEPROMs 804a and 804b. The recording apparatus also includes a carriage motor 808, a conveyance motor 809, and an alternating current/direct current (AC/DC) power source 806 for generating voltage from a commercial power source. A direct current to direct current (DC/DC) converter 805 receives electric power supply from the AC/DC power source 806 to generate a logic voltage.

The DC/DC converter 805 also includes a drive block for driving a motor which drives the carriage motor 808 and the conveyance motor 809.

A drive circuit 807 drives a recording element mounted on the recording head. The EEPROMs 803a and 803b, and the drive circuit 807 are circuits which are mounted on the recording head.

When the recording apparatus is, for example, in an operable mode, the recording apparatus executes recording operation in parallel to an operation mode based on a predetermined event (commands and data are received from host apparatus or an operation is carried out in an operation panel mounted on recording apparatus). After the recording operation is completed, the recording apparatus proceeds to the operable mode.

For example, when the recording operation is not executed for a predetermined period (that is, if the recording apparatus is in the operable mode), the recording apparatus proceeds from the operable mode (operable state) to a standby mode (standby state). In this case, the DC/DC converter 805 suspends electric power supply to the EEPROMs 804a and 804b. The recording apparatus can reduce electric power consumption by executing such control.

In the standby mode, when the predetermined event takes place again (a predetermined phenomenon occurs), the recording apparatus proceeds to the operable mode (operable state). In the operable mode, the DC/DC converter 805 executes electric power supply to the EEPROMs 804a and 804b. Thus, the recording apparatus prepares for the recording operation.

Other Exemplary Embodiments

Elements to be connected to an ASIC may be a clock integrated circuit (IC) (real time clock).

Further, a format used for transferring data to elements which are connected to an ASIC is not limited to a serial format but may be data transfer using a parallel format.

In FIG. 1, a voltage to be supplied to the elements 108a and 108b, and a voltage to be supplied to the elements 109a and 109b are 3.3 volts respectively but may be a different voltage. For example, a voltage to be supplied to the elements 108a and 108b may be 3.3 volts and a voltage to be supplied to the elements 109a and 109b may be 5 volts.

Furthermore, a voltage value is not limited to the above voltages but may be, for example, 1.8 volts or 9 volts.

Further, proceeding from a standby mode to an operable mode is not limited to the above described condition.

Further, while as an electronic apparatus, a recording apparatus is described in the present exemplary embodiments, the present invention can be applied to an image reading apparatus or a portable terminal.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

What is claimed is:

1. A circuit comprising:
   a first terminal configured to connect a first element to which an electric power is supplied from a power source;
   a second terminal configured to connect a second element to which the electric power is supplied from the power source, the second terminal being different from the first terminal and the second element being different from the first element;
   a command issuing unit configured to issue a command to the first element connected via the first terminal and the second element connected via the second terminal;
   a third terminal configured to obtain information for specifying whether the electric power has been supplied to each of the first element connected via the first terminal and the second element connected via the second terminal, the third terminal being different from the first terminal and the second terminal; and
   a control unit configured to control the command issuing unit to disable the issuing the command by the command issuing unit to the first element connected via the first terminal if the information obtained via the third terminal states that the electric power has not been supplied to the first element connected via the first terminal and to disable the issuing the command by the command issuing unit to the second element connected via the second terminal if the information obtained via the third terminal states that the electric power has not been supplied to the second element connected via the second terminal.

2. The circuit according to claim 1, further comprising a determination unit configured to determine whether the electric power is supplied to the first element and the second element by determining each of voltage levels of the first element and the second element.

3. The circuit according to claim 1, further comprising a power source control unit configured to control the power supply of the power source to the first element and the second element, the and a determination unit configured to determine whether the electric power is supplied to each of the first element and the second element in accordance with a status of the power source control unit.

4. A controlling method of a circuit comprising:
   obtaining, via a first terminal of the circuit, information for specifying whether an electric power has been supplied to each of a first element connected to the circuit via a second terminal of the circuit, a second element connected to the circuit via a third terminal of the circuit, the first terminal, the second terminal and the third terminal being different from each other;
   and
   disabling issuing a command to the first element connected to the circuit via the second terminal if the obtained information states that the electric power has not been supplied to the first element which is connected to the circuit via the second terminal and disabling issuing a command to the second element connected to the circuit via the third terminal if the obtained information states that the electric power has not been supplied to the second element which is connected to the circuit via the third terminal.

* * * * *